United States Patent [19]

Kramer

[11] 4,228,446
[45] Oct. 14, 1980

[54] REDUCED BLOOMING DEVICE HAVING ENHANCED QUANTUM EFFICIENCY

[75] Inventor: William M. Kramer, Lancaster, Pa.

[73] Assignee: RCA Corporation, New York, N.Y.

[21] Appl. No.: 37,832

[22] Filed: May 10, 1979

[51] Int. Cl.$^3$ .................................... H01L 27/14
[52] U.S. Cl. ................................ 357/31; 357/30; 357/23
[58] Field of Search ....................... 357/31, 30, 23

[56] References Cited

U.S. PATENT DOCUMENTS

| 3,548,233 | 12/1970 | Cave | 313/65 |
| 3,755,015 | 8/1973 | Redington | 148/188 |
| 3,786,294 | 1/1974 | Wilson | 313/65 AB |
| 3,792,197 | 2/1974 | Chai | 128/7.1 |
| 3,904,453 | 9/1975 | Revesz | 156/3 |

Primary Examiner—Martin H. Edlow
Attorney, Agent, or Firm—Eugene M. Whitacre; Glenn H. Bruestle; Vincent J. Coughlin, Jr.

[57] ABSTRACT

An imaging device such as silicon vidicon has a wafer of single crystal semiconductor material having an input sensing region and a charge storage region. A potential barrier is included for controlling the blooming within the sensing region, and a passivation layer is provided for stabilizing the blooming characteristics. A coating, preferably zirconium oxide, is deposited on the passivation layer to combine with the passivation layer to form an anti-reflection region for enhancing the quantum efficiency of the device. The anti-reflection region has an optical thickness substantially equal to an odd multiple of a quarter of a wavelength of light incident on the device.

7 Claims, 3 Drawing Figures

REDUCED BLOOMING DEVICE HAVING ENHANCED QUANTUM EFFICIENCY

BACKGROUND OF THE INVENTION

This invention relates to sensing devices incorporating single crystal semiconductor wafers and more particularly to a reduced blooming vidicon having an improved anti-reflection coating for increased quantum efficiency of the device.

Sensing devices such as silicon vidicons and silicon intensifier tubes employ sensing elements or targets comprising single crystal semiconductor wafers. The operation of such sensing elements in these devices is well known in the art. Recently, improvements have been made in reducing and stabilizing the blooming effects of these targets as described in pending patent application Ser. No. 838,713, filed Oct. 3, 1977 by Savoye et al., entitled "Reduced Blooming Devices." Although the blooming characteristics of these devices have been improved, the quantum efficiency is unaffected. As described in the aforementioned application, the reduced blooming characteristics of the target are stabilized by depositing a passivating layer of boron containing silica glass onto the input signal sensing surface of the silicon target. Prior to the recent advances in reduced blooming targets, the silicon targets had been coated with an anti-reflecting coating of silicon monoxide, which is well known in the art. Using this silicon monoxide coating, it was typical to achieve quantum efficiencies approaching 96–97% at certain wavelengths of incident light. However, deposition of the silicon monoxide anti-reflecting layer on the passivating layer of the reduced blooming targets produces little, if any, improvement in the quantum efficiency of the reduced blooming device. It is thus desirable to achieve a sensing device that has reduced and stabilized blooming characteristics and improved quantum efficiency.

SUMMARY OF THE INVENTION

An imaging device has a wafer of single crystal semiconductor material, the wafer having a first surface with an input sensing region and a second surface with a charge storage region. Included in the sensing region is a potential barrier for controlling the blooming within the sensing region. A passivation layer for stabilizing the atomic energy level is included along the first surface. The device is improved by a coating on said passivation layer for reducing reflection and increasing absorption of light incident upon the device. The coating and passivation layer in combination form an anti-reflection region having an optical thickness substantially equal to an odd multiple of a quarter of the wavelength of light incident upon the device.

DETAILED DESCRIPTION OF THE PREFERRED EMBODIMENT

Figure 1:
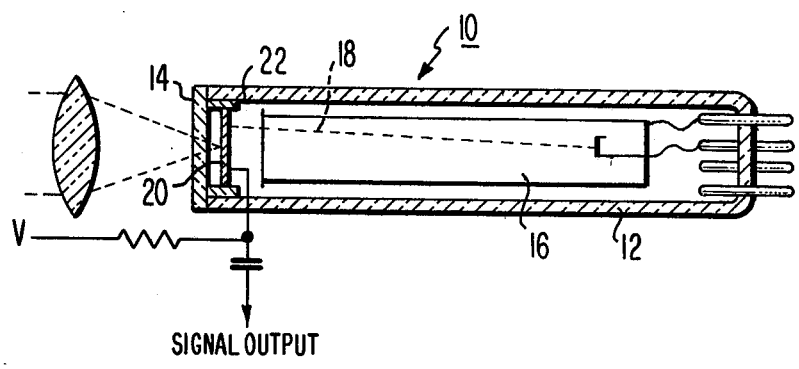
FIG. 1 is a longitudinal sectional view of an improved vidicon camera tube utilizing the novel sensing element.

A preferred embodiment of the invention is a vidicon type camera tube 10 as shown in FIG. 1 having an evacuated envelope 12 and including a transparent faceplate 14 at one end of the envelope 12, and an electron gun assembly 16 inside the envelope 12 for forming a low velocity electron beam 18. An input signal sensing element or target 20, mounted on a metallic spacer 22, is positioned adjacent to the inside surface of the faceplate 14 in a manner suitable for receiving a light input image signal. Means (not shown) for magnetically focusing the beam 18 toward the target 20 and for causing the beam 18 to scan the surface of the target 20 may be disposed outside the envelope 12.

Figure 2:
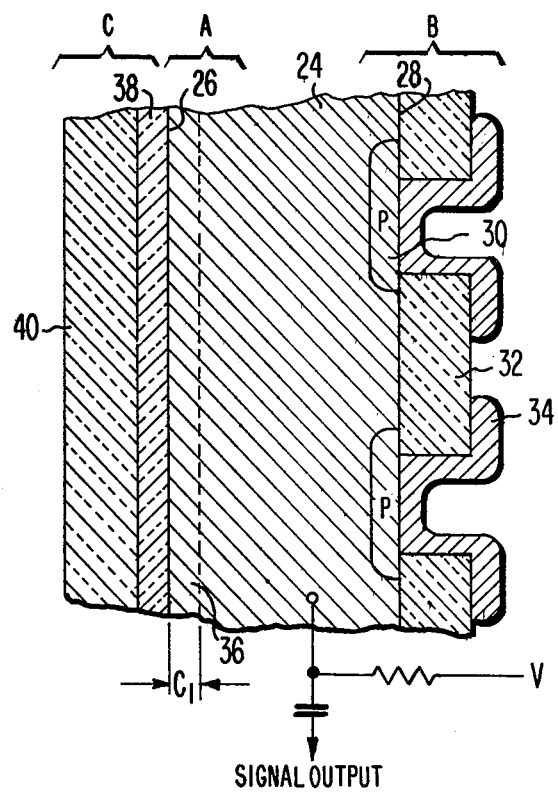
FIG. 2 is an enlarged fragmentary sectional view of a sensing element or target suitable for use in the tube of FIG. 1.

The photon-excitable target 20, a fragment of which is shown in FIG. 2, is a wafer-shaped silicon photodiode target having an N type bulk region 24 of a single crystal of elemental silicon with first and second opposed major surface 26 and 28, respectively. The first major surface 26 comprises the input signal sensing surface of the target 20 for receiving an input light image. The second major surface 28 faces the electron beam, when mounted in the tube of FIG. 1, and is referred to, for simplicity, as the scan surface 28 of wafer 24.

The wafer 24 includes a charge storage region "B" along a surface portion including the scan surface 28, and an input surface region "A" along the surface portion including the input signal sensing surface 26. The charge storage region "B" includes at the scan surface 28 of the silicon wafer 24, an array of discrete PN junction storage diodes 30. An insulating layer 32 of silicon dioxide is provided on the scan surface 28 between the discrete diodes 30 to shield the bulk of the wafer 24 from the effects of the scanning electron beam 18. Contact pads 34 of P type silicon are provided which cover the P type surfaces of the discrete diodes 30 and overlap the insulating layer 32 about the periphery of the diode 30 in a manner well known in the art. Such pads 34 improve the contacts of the scanning beam 18 with the diodes 30.

An N+ potential barrier 36 is provided within the wafer 24 for a distance of $C_1$ from the input signal sensing surface 26 for accomplishing blooming control. $C_1$ represents the distance from the surface 26 to the peak of N+ distribution. The N+ potential barrier is preferably located such that $C_1$ is less than about 1500 Å. The distribution of the doping profile in the region of the N+ potential barrier relative to the N type bulk of the silicon wafer 24, should have the characteristics ($B_1$ and $B_2$) necessary for achieving the blooming reduction mechanism described in "Theory, Design, and Performance of Low-Blooming Silicon Diode Array Imaging Targets," by B. M. Singer and J. Kostelec in *IEEE Trans. on Electron Devices*, Vol. ED-21, pp. 84–89, January 1974.

"Passivation," i.e., providing electrical stability of the atomic energy level for stabilizing blooming characteristics in the device, is provided by a transparent insulating material 38 along the input signal sensing surface 26 of the semiconductor wafer 24, including sufficient non-mobile negative charge for inducing or causing an inversion behavior along that surface whereby a P+ like region is provided along the input signal sensing surface 26 by field-effect, effectively fixing the valence band $E_V$ in that surface region of the wafer 24, substantially at the Fermi level $E_F$.

As heretofore described, the target 20 is constructed and processed according to the aforementioned pending patent application, Ser. No. 838,713, filed Oct. 3, 1977 by Savoye et al., and herein incorporated by reference.

In accordance with their structure, it is preferable that the transparent material 38 be a borosilicate glass ($B_2O_3$-$SiO_2$) such as "Vycor" (tradename) manufactured by Corning Glass Works of Corning, New York, having a composition consisting essentially of about 96% $SiO_2$ and about 4% $B_2O_3$. Such a material hase been found to possess adequate non-mobile negative charge, after deposition, to achieve the desired inversion behavior in the wafer for suitable passivation of the device. Although the device as described herein so far has reduced and stabilized blooming characteristics, it has undesirably low quantum efficiency.

According to the present structure, it has been found that the quantum efficiency of the device is improved by forming an anti-reflection layer along the input signal sensing surface 26. A transparent coating 40 of suitable index of refraction is deposited on the transparent material 38. The coating 40 and material 38 combine to form an anti-reflecting region "C" having an optical thickness of an odd multiple of a quarter of a wavelength of incidental light that reduces reflections of incident light and increases the absorption of the light to thereby increase the sensitivity of the device. Where the semiconductor wafer is silicon having an index of refraction of about 3.5 and the transparent material 38 is borosilicate glass having an index of refraction of about 1.45, it has been determined that the index of refraction of the transparent coating 40 should be in the range of about 1.8 to 2.2.

A number of materials such as cerium oxide, antimony oxide, bismuth oxide, and zirconium oxide, which have indices of refraction in the desired range, are useful. Zirconium oxide is preferred. It should be understood, however, that in certain circumstances or in special applications, any other materials useful for anti-reflective purposes may be more desirable.

In the manufacture of the target 20, the charge storage region "B" may be fabricated in the manner fully described in U.S. Pat. No. 3,548,233 issued to E. F. Cave et al. on Dec. 15, 1970 and herein incorporated by reference. The anti-reflecting region "C" may be formed by first inserting the target in a conventional evaporator prepared by any conventional means capable of attaining a vacuum of $1 \times 10^{-5}$ torr. It is preferable to use an oilless system to minimize spurious signals in the resulting targets. The evaporator is fitted with an electron beam gun capable of depositing borosilicate glass, preferably "Vycor" and the coating material 40, preferably zirconium oxide ($ZrO_2$) sequentially. The Vycor and $ZrO_2$ are preferably in the form of pellets or chunks to minimize sputtering. The Vycor is heated by the electron beam gun, allowed to outgas, then evaporated at a deposition rate of about 250 Angstroms (Å) per minute as monitored and/or controlled by any well-known device such as a Sloan Thickness Monitor. A shutter inserted between the source and the targets is then opened and preferably about 80 Å of Vycor is deposited along the input sensing surface 26 of the target. The shutter is then closed and the electron beam turned off.

The power is then turned on to the $ZrO_2$ source, the material outgassed, and evaporated at a deposition rate of about 210 Angstroms per minute. The shutter is opened and $ZrO_2$ is deposited preferably to a thickness of about 550 Å. The shutter is then closed and the power turned off.

Figure 3:
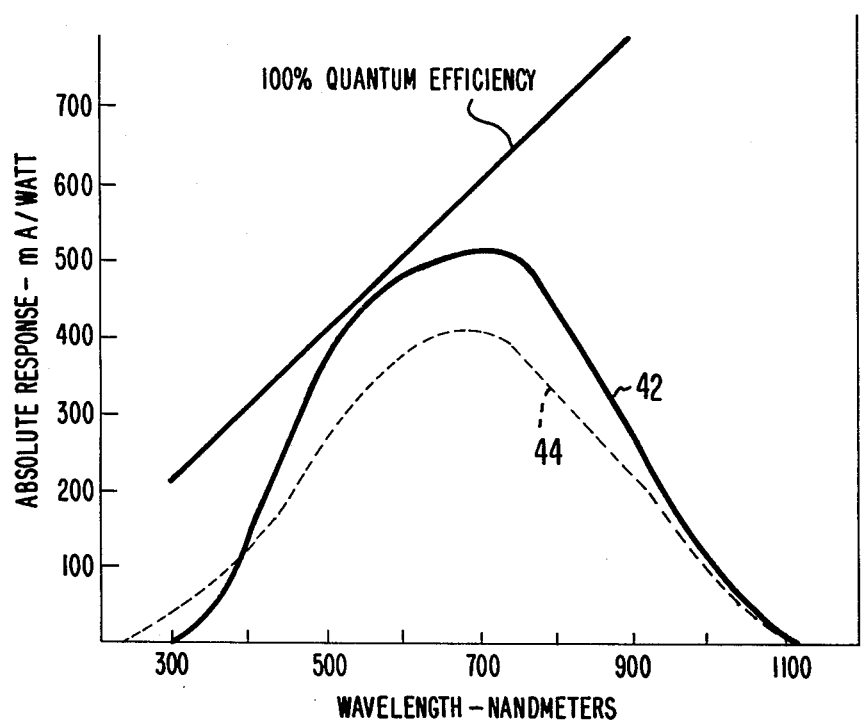
FIG. 3 is a graph showing the improved quantum efficiency of a device utilizing the novel target.

Devices made in accordance with these thicknesses exhibit nearly 100% quantum efficiency in the wavelength range of about 550-600 nanometers as shown in FIG. 3 which is a graph of absolute response in milliamperes per watt (mA/Watt) versus wavelength in nanometers. Curve 42 represents the response of the device including the novel anti-reflection region. Curve 44 represents the response of reduced blooming device having a Vycor layer for blooming stabilization. It can be seen that although the peak response for the novel device is in the wavelength range of 500-600 nanometers, the response is enhanced over a range from about 400-1000 nanometers. It should be understood that other thickness combinations can be used to peak the response at various wavelengths.

Although described in the preferred embodiment of a silicon vidicon target, it should be noted that the anti-reflection region for enhancing quantums efficiency is also applicable to solid state charge storage imaging devices such as CCD's and CID's. Similarly, such a region may also be used with sensing elements of single or multiple line array type imaging devices.

What is claimed is:

1. In an imaging device of the type having a wafer of single crystal semiconductor material, the wafer having a first surface with an input sensing region and a second surface with a charge storage region, a potential barrier in the sensing region for controlling the blooming within said sensing surface region and a passivation layer for stabilizing the atomic energy level along the first surface, the improvement comprising a coating on said passivation layer for reducing reflection and increasing absorption of light incident upon said device, said coating and said passivation layer in combination forming an anti-reflecting region having an optical thickness substantially equal to an odd multiple of a quarter of the wavelength of the light incident upon said device.

2. In a charge storage device of the type having a single sensing element with an input signal sensing surface region and a charge storage region, and reading means for selectively contracting portions of said charge storage region, said sensing element including (a) a single crystal semiconductor wafer having a (1) plurality of discrete storage regions along a second surface, (2) a bulk region in said wafer, and (3) means for controlling blooming within said signal sensing surface region, and (b) a passivation layer for stabilizing the atomic energy level along a first surface of said wafer, the improvement comprising a coating on said passivation layer for improving the quantum efficiency of said device, said coating and said passivation layer in combination forming an anti-reflecting region having an optical thickness substantially equal to an odd multiple of a quarter of the wavelength of the light incident upon said device.

3. An imaging device according to claim 2, wherein said passivation layer comprises a borosilicate glass.

4. An imaging device according to claim 3, wherein said coating means comprises a coating of material having an index of refraction in the range of 1.8 to 2.2.

5. An imaging device according to claim 4, wherein said material is selected from the group consisting of zirconium oxide, cerium oxide, bismuth oxide, and antimony oxide.

6. An imaging device according to claim 5, wherein said material is zirconium oxide.

7. An imaging device according to claim 6, wherein said zirconium oxide has a thickness of about 550 Å and said borosilicate glass has a thickness of about 80 Å.

* * * * *

UNITED STATES PATENT AND TRADEMARK OFFICE
CERTIFICATE OF CORRECTION

PATENT NO. : 4,228,446
DATED : October 14, 1980
INVENTOR(S) : William Meigs Kramer It is certified that error appears in the above-identified patent and that said Letters Patent is hereby corrected as shown below:

Column 2, line 16 change "surface" to --surfaces--.

Column 4, line 39 change "contracting" to --contacting--.

Signed and Sealed this

Tenth Day of November 1981

[SEAL]

Attest:

GERALD J. MOSSINGHOFF

Attesting Officer

Commissioner of Patents and Trademarks